US008462238B2

(12) United States Patent
Fredembach et al.

(10) Patent No.: US 8,462,238 B2
(45) Date of Patent: Jun. 11, 2013

(54) CAMERA DESIGN FOR THE SIMULTANEOUS CAPTURE OF NEAR-INFRARED AND VISIBLE IMAGES

(75) Inventors: Clément Fredembach, Servion (CH); Yue Lu, Arlington, MA (US); Sabine Süsstrunk, Lausanne (CH)

(73) Assignee: Ecole Polytechnique Fëdërale de Lausanne (EPFL), Lausanne (CH)

( * ) Notice: Subject to any disclaimer, the term of this patent is extended or adjusted under 35 U.S.C. 154(b) by 9 days.

(21) Appl. No.: 12/998,567

(22) PCT Filed: Sep. 8, 2009

(86) PCT No.: PCT/IB2009/053919
§ 371 (c)(1),
(2), (4) Date: Jun. 20, 2011

(87) PCT Pub. No.: WO2010/052593
PCT Pub. Date: May 14, 2010

(65) Prior Publication Data
US 2011/0249157 A1    Oct. 13, 2011

Related U.S. Application Data

(60) Provisional application No. 61/111,008, filed on Nov. 4, 2008.

(51) Int. Cl.
*H04N 5/335* (2011.01)
(52) U.S. Cl.
USPC .......................................... 348/273; 348/279

(58) Field of Classification Search
USPC ................. 348/272, 273, 275, 277, 278, 279, 348/336
See application file for complete search history.

(56) References Cited

U.S. PATENT DOCUMENTS

| | | | |
|---|---|---|---|
| 5,926,238 A * | 7/1999 | Inoue et al. | 349/61 |
| 7,109,470 B2 * | 9/2006 | Kohler | 250/226 |
| 8,018,509 B2 * | 9/2011 | Numata | 348/276 |
| 2003/0169354 A1 | 9/2003 | Aotsuka | |
| 2004/0169749 A1 | 9/2004 | Acharya | |
| 2006/0054782 A1 | 3/2006 | Olsen et al. | |
| 2006/0066738 A1 | 3/2006 | Hershey et al. | |
| 2006/0221250 A1 * | 10/2006 | Rossbach et al. | 348/630 |
| 2007/0146512 A1 * | 6/2007 | Suzuki et al. | 348/272 |
| 2007/0272836 A1 | 11/2007 | Higashitsutsumi et al. | |
| 2008/0087800 A1 * | 4/2008 | Toda | 250/214 C |

OTHER PUBLICATIONS

International Search Report, Dec. 15, 2009.

* cited by examiner

*Primary Examiner* — Tuan Ho
*Assistant Examiner* — Zhenzhen Wu
(74) *Attorney, Agent, or Firm* — Harness, Dickey & Pierce, P.L.C.

(57) ABSTRACT

The present invention aims to capture two images simultaneously in the visible part of the spectrum and a NIR image. This is achieved through a camera for simultaneously capturing a visible and near-infrared image by at least a sensor producing sensor response data and having at least one color filter array (CFA) comprising at least four different filters, said color filter array having visible and near-infrared light filters, and said camera comprising means to obtain a visible image while using the sensor response data from the visible part of the spectrum and a NIR image using the sensor response data from the near-infrared part of the spectrum.

14 Claims, 5 Drawing Sheets

CAMERA DESIGN FOR THE SIMULTANEOUS CAPTURE OF NEAR-INFRARED AND VISIBLE IMAGES

CROSS-REFERENCE TO RELATED APPLICATIONS

This application claims priority under 35 U.S.C. Section. 119 to US provisional application No. 61/111,008, filed Nov. 4, 2008, the contents of which are hereby incorporated by reference herein.

INTRODUCTION

The present invention is in the field of the acquisition of color images and the treatment thereof and aim at providing images in which the full spectrum of silicon sensitivity is taken into account.

BACKGROUND ART

The part of the electromagnetic spectrum traditional camera sensors are sensitive to ranges from ultra-violet (200-400 nm), visible light (400-700 nm) to near-infrared (700-1100 nm). While UV radiation is generally filtered out by the camera's optical elements, this is not the case for NIR. Indeed, this lack of absorption combined with the sensors' relatively high sensitivity to NIR has forced camera designers to append a specific filter, usually named "hot-mirror", in front of the camera sensor. This is done because near-infrared is regarded as noise in the colour image formation process, as it results in "false" information in the colour channels.

By filtering out such a large part of the spectrum, however, a significant amount of potentially valuable information is lost. Moreover, near-infrared photography has existed for a long time and has been rightly popular in diverse areas such as portrait, wedding, and landscape photography, as well as astronomical imaging. The digital age has further increased consumers' interest in this form of photography, seeing that near-infrared film photography's main shortcoming was the lengthy exposure time that was required. Silicon-based sensors, however, permit exposure times that are equal to their visible light counterparts, thus making near-infrared digital photography a viable alternative.

In a typical digital camera, incident light passes through an optical focusing element (the lens), is filtered by an NIR and/or UV filter (hot-mirror) and is sampled by a colour filter array (CFA) before hitting the sensor (CCD, CMOS or other silicon-based sensor). The sensor converts incoming electromagnetic energy quanta into a voltage that is read by the camera software so as to form a raw image. This raw image is then generally further processed, in-camera, to create a full colour image, to improve the realism of colours (white balancing), to remove inherent noise, to sharpen the details, and more.

The output of a camera consists of a computer-readable file that contains three channels: red, green, and blue, akin to most displays on which images are viewed. We now focus on the physical elements that one has to replace if a high-quality near-infrared image is to be obtained in conjunction with a high-quality colour image: the hot-mirror and the CFA.

A hot-mirror is a piece of plastic or glass whose function is to filter out (by means of absorption or reflection) wavelengths that do not belong to the visible spectrum. Considered as a filter, its transmittance (exemplified in FIG. 2) is akin to a band-pass filter, as traditional sensor sensitivity to electromagnetic waves is much broader (see FIG. 3). Since radiation outside of the visible spectrum is often regarded as undesirable as the human visual system is not sensitive to it, most cameras incorporate such a hot-mirror in one form or another.

A commonly used technique to transform a standard camera into a near-infrared camera is to dismantle the camera and replace the hot-mirror by either a piece of clear glass (for focusing reasons) or an opposite filter, i.e., a filter that blocks the visible light while allowing only near-infrared light to proceed. The use of a near-infrared filter results in having a camera that cannot image the visible spectrum anymore. While the clear glass approach allows the entire range of the spectrum to be imaged, current camera designs do not allow to distinguish between the visible and near-infrared parts of the spectrum. The resulting image is therefore "wrong" and not compelling (effectively, near-infrared and visible light is merged into an RGB colour image). An alternative is to use lens-mounted filters, a hot-mirror and its opposite, to obtain two distinct image of the same scene.

BRIEF DESCRIPTION OF THE INVENTION

The invention we describe here will allow one to capture both these images simultaneously. In the designs we present, the hot-mirror can either be replaced by a specific filter or removed altogether.

This aim is achieved through a camera for simultaneously capturing a visible and near-infrared image by a sensor having a colour filter array comprising at least 4 different filters, said colour filter array having visible and near-infrared light filters, and said camera comprising means to obtain a first image while using the sensor response signal from the light passing through the visible filter and a second image using the sensor response signal from the light passing through the near-infrared filter.

Our contribution, and its novelty, is to provide a viable sensor design that can simultaneously capture both the visible and NIR parts of the spectrum with an equivalent image quality to current cameras. Furthermore, we show how that captured data can be outputted as an image that contains visible and near-infrared channels, at full sensor resolution. In this invention, we define the visible image as having color channels that are visible to the human visual system (e.g., red/green/blue, cyan/yellow/magenta, grey scale, etc.), and the NIR image as having one or more channels that contain NIR information only. Meanwhile, the visible and near-infrared channels can be obtained either simultaneously, or via a sequential process where one first obtain one of the channels, from which other channels are further reconstructed.

BRIEF DESCRIPTION OF THE FIGURES

The present invention will be better understood thanks to the attached figures in which.

DETAILED DESCRIPTION

Figure 1:
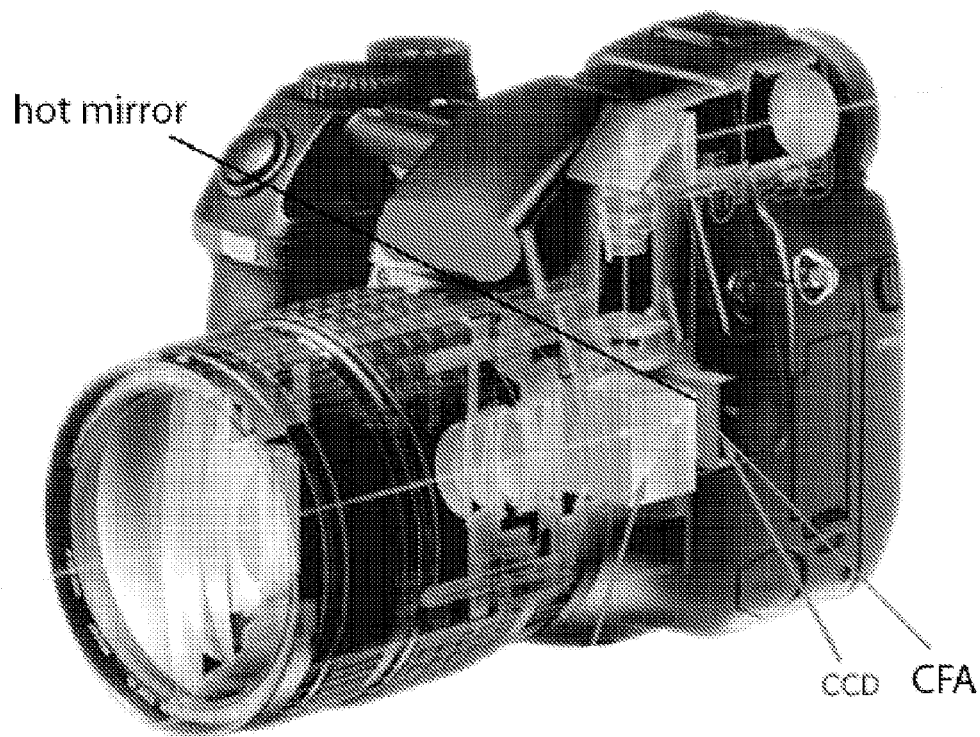
FIG. 1: Schematic design of a camera and location of relevant parts within.
Figure 2:
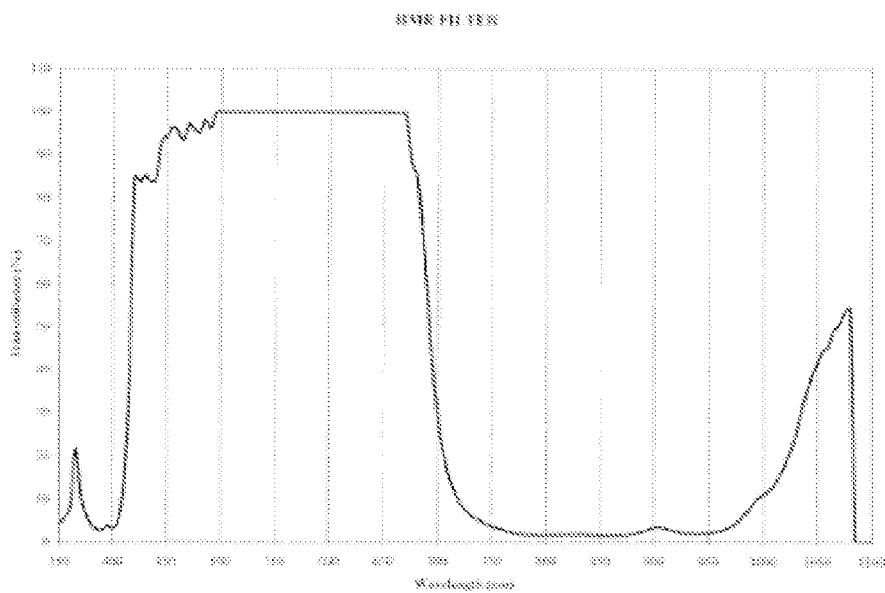
FIG. 2: Sample transmittance of a hot-mirror

The colour filter array is an essential component of a classical digital camera (see FIG. 1). There are several other such designs, including some that do not use RGB filters or that use more than three. The Bayer Pattern being by far the most common CFA, it is the one we use as an example.

Figure 4:
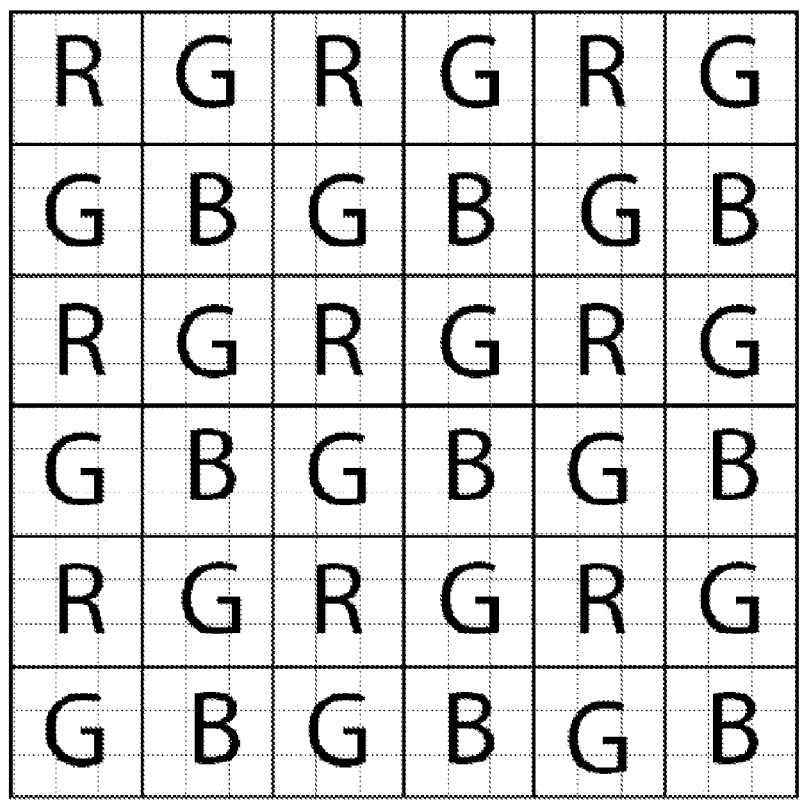
FIG. 4: Arrangement of red, green and blue filters in a Bayer Pattern

Indeed, the photosensitive material that composes a camera's sensor is, in essence, colour blind. This is only natural given that the sensor's purpose is to convert electromagnetic energy into electrical charge, this is done regardless of the incident light's wavelength, provided it is one the sensor is sensitive to. In order to evolve from a monochromatic (i.e., grey scale) image to a colour one, the preferred solution is to append an array of coloured filter in front of the sensor. This array is composed of a mosaic of coloured transparent material that let only a portion of the spectrum pass trough. The most commonly encountered CFA is the Bayer Pattern illustrated in FIG. 4. In this configuration, each one of the sensor's cell (i.e., the image pixels) receives only red, green, or blue information. It follows that while the sensor data is effectively a colour image, the colour information is not evenly distributed as there is a single colour per pixel.

To go from this raw image to a full resolution colour image, the camera software performs an operation known as "demosaicking" which consists in restoring the missing colour values from the sensor data. This operation uses information from a pixel's neighbourhood to infer what the missing colours should be. This step is essential, as its performance has a direct influence on the final (from a camera's workflow perspective) image quality. The colour filter array and associated demosaicking algorithm is an area that will be non-trivially addressed in order to produce a high-quality near-infrared and colour image.

Finally, while we use the Bayer pattern and red, green, and blue filters as an example in this document, there is no theoretical nor practical reason not to use other filters. One can readily build a cyan, yellow, and magenta CFA, which would have similar properties to an RGB one. Similarly, the number of filter used is not fixed to three and one can thus build a red, green, blue, cyan, yellow, and magenta colour filter array. In general, the CFA can include any number of visible channels. The invention we disclose here for capturing near infrared only distinguishes between filters that have only a visible transmittance, filters that have a visible and near-infrared transmittance, and filters that have only a near-infrared transmittance. The number, placement, or colour of the filters depends on the intended application for the images.

Near-Infrared Light

Figure 5:
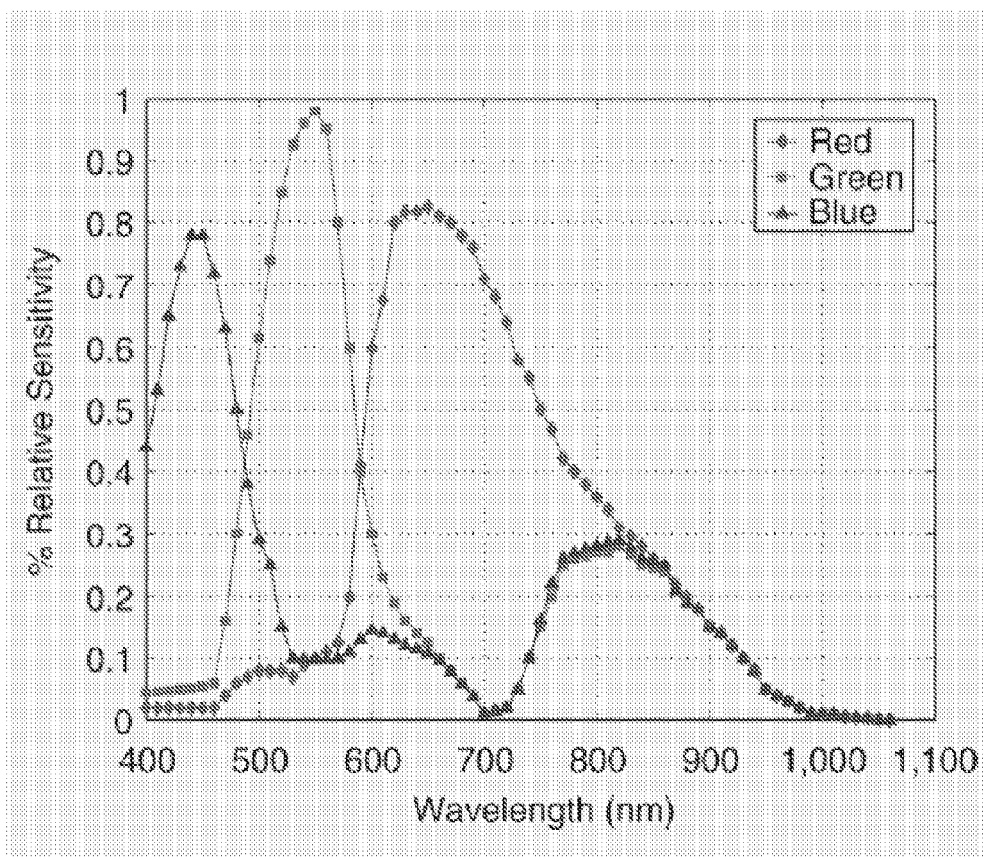
FIG. 5: Spectral transmittance of typical CFA red, green, and blue filters

An intriguing property of NIR is that it is, to a degree, transparent to most colorants and dyes. This property is essential in designing an NIR-colour camera. For generality, and because precise values can differ depending on specific equipment, we define that near-infrared "starts" at a wavelength of $\lambda_1$ (usually 700 nm). At $\lambda_1$, a CFA composed of red, green, and blue filters (for simplicity's sake) will have a high response at the red filters' location and an almost null response at the blue and green locations. This behaviour, however, swiftly changes so that at a wavelength $\lambda_2$ (usually 800 nm) all three filters have an equal, significant, transmittance. This trend continues until $\lambda_3$ (1100 nm but highly variable) where the sensor exhibit no more sensitivity, see FIG. 5 for an illustration of this property. If one wants to accurately recover both the visible (400-700 nm) and NIR (700 or 800-1100 nm) images, then the behaviour of the filters between $\lambda_1$ and $\lambda_2$ as well as after $\lambda_2$ is key.

Near-Infrared Camera Design

In designing a camera for near-infrared and visible light imaging purposes, one has to identify the elements that are to be modified and the ones that will remain unchanged. For the purpose of illustration, let us consider that a camera is defined as per FIG. 1. In this general configuration, the only elements that have to be modified are: the hot-mirror, the colour filter array, and the camera's software. In the following, we introduce two different designs for the CFA and hot-mirror replacement/modification. The software part is addressed independently, as it is very similar for both designs.

Stop-Band Filter Design

Figure 6:
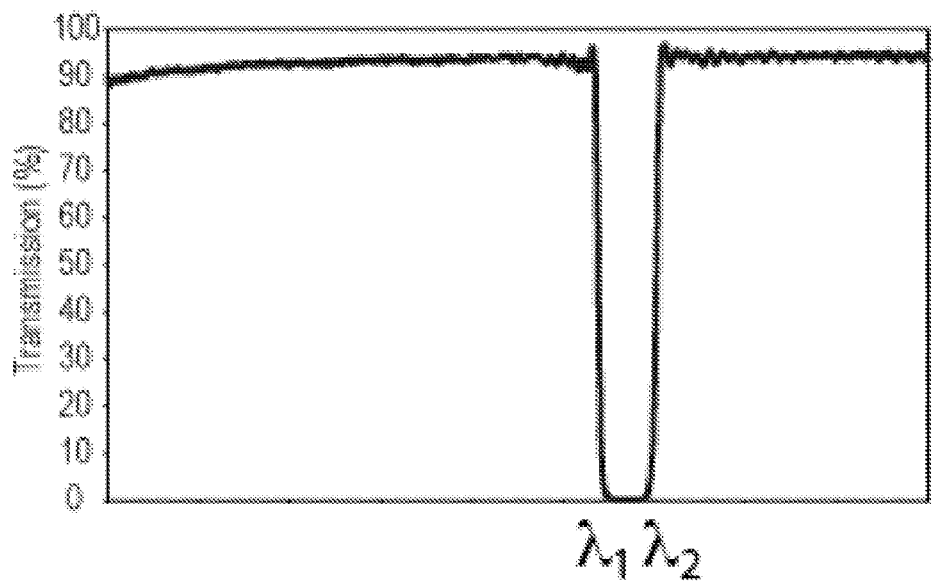
FIG. 6: Illustration of the transmittance of a stop-band filter

The first camera design replaces the hot-mirror by a stop-band filter. Said stop-band filter is placed so that it filters the light prior to the light reaching the sensor. Specifically, the goal of this particular filter is to pass all wavelengths, except for a narrow band between $\lambda_1$ and $\lambda_2$ where the signal is blocked ($\lambda_1$ and $\lambda_2$ are defined as in the previous section), the transmittance of such a filter is shown in FIG. 6. This filter's primary use is to ensure that all NIR information reaching the sensor via the CFA is the same at all locations (since $\lambda_2$ is defined as the shortest wavelength beyond which all of the CFA filters have an identical NIR response).

Let us, for simplicity, assume a Lambertian model of image formation and that the visible image is obtained with red, green, and blue filters. In a conventional camera, the colour signal is obtained as:

$$K_V = \int_\omega E(\lambda)S(\lambda)Q_K(\lambda)d\lambda \tag{1}$$

where $E(\lambda)$ and $S(\lambda)$ are the illuminant spectral power distribution and surface reflectance, respectively. $K=\{R, G, B\}$ and $Q_K(\lambda)$ represents the transmittance of the coloured filter K. $\omega$ denotes the wavelength interval in which a signal can be acquired; for normal colour images, $\omega=[400 \text{ nm}-\lambda_1]$.

In the proposed design, removing the hot mirror extends the sensitivity of the camera, while the stop-band filter constrains it. The colour signal obtained is thus:

$$K = \int_{\omega 2} E(\lambda)S(\lambda)Q_K(\lambda)d\lambda \tag{2}$$

with $\omega_2=[400 \text{ nm}-\lambda_1]\cup[\lambda_2-\lambda_3]$. We can thus decompose K as $K=K_V+K_{IR}$, where:

$$K_{IR} = \int_{\omega 3} E(\lambda)S(\lambda)Q_K(\lambda)d\lambda \tag{3}$$

and $\omega_3=[\lambda_2-\lambda_3]$. By definition, $R_{IR}=G_{IR}=B_{IR}$, and so $NIR=K_{IR}$ $\forall K$. It follows that $K_V=K-NIR$, which demonstrate that a visible colour image can be reconstructed without loss using the proposed design. The NIR image itself is obtained easily given that the NIR pixels are not "corrupted" with visible data.

Figure 3:
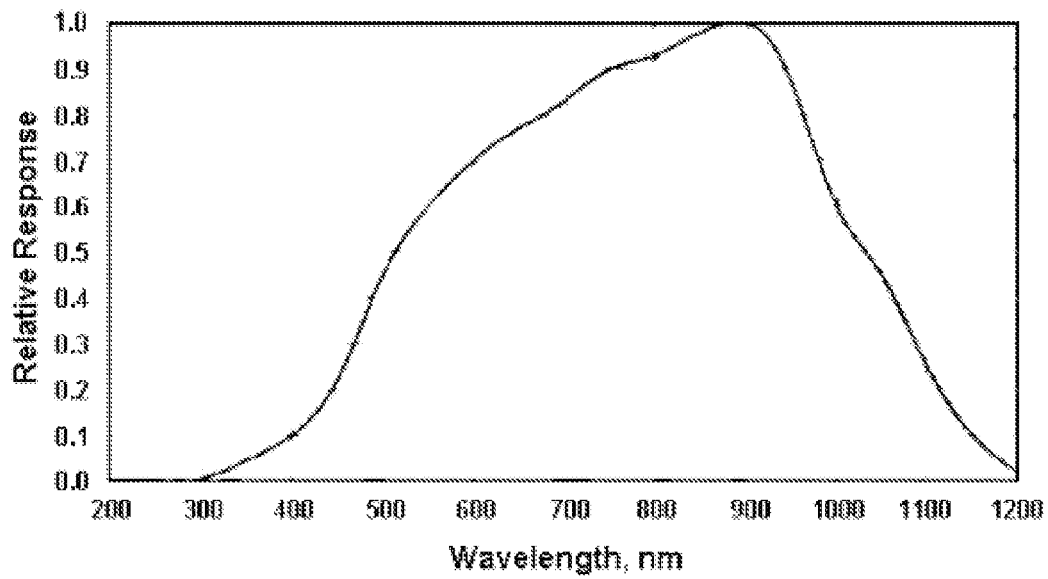
FIG. 3: Typical sensitivity of photosensitive silicon

The CFA design for this construction is one of N+1 different filters, where N is the number of filters used to image the visible part of the spectrum. For generality's sake, let us take the standard Bayer Pattern (FIG. 3) as an example. NIR information can be acquired, in addition to visible information, by replacing some of the red, green, or blue filters by a near-infrared only filter. This filter has to have an equivalent transmittance to the coloured filters'. This can be obtained either by designing an ad-hoc near-infrared filter, or, in an easier manner, by appending the filter shown in FIG. 7 to any of the CFA's colour filter (since their transmittance is equal for all wavelengths greater than $\lambda_2$).

Figure 8:
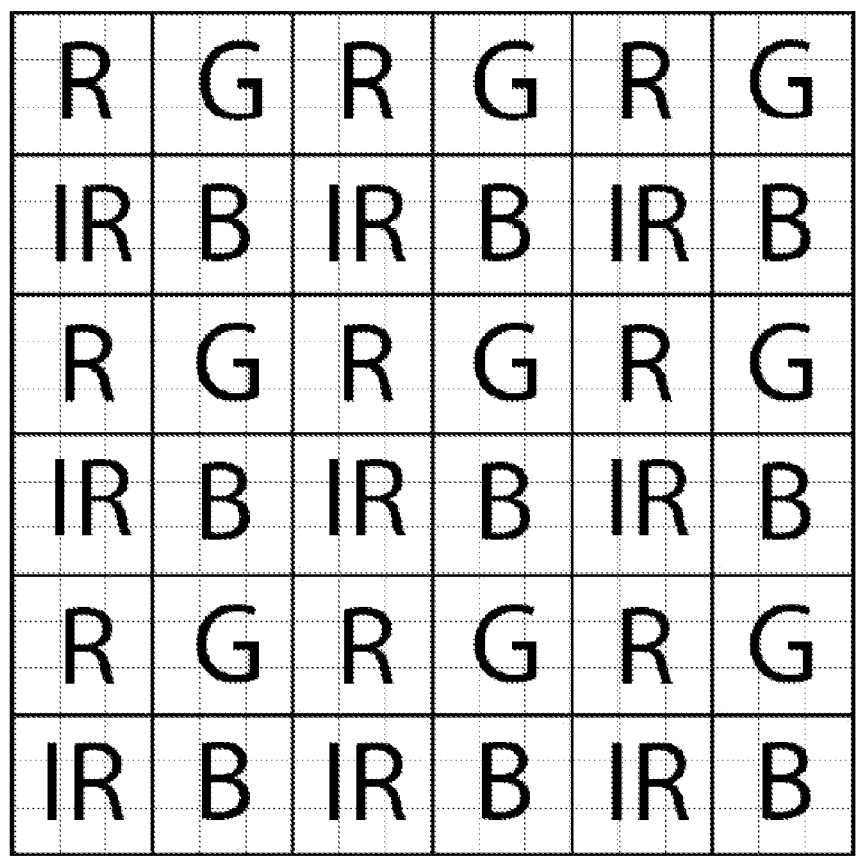
FIG. 8: A possible arrangement of red, green, blue, and near-infrared filters on a CFA

The number of different filters, their transmittance, and their placement on the sensor can vary widely. The goal is to maximise image quality, from a fidelity and resolution perspective. The design presented here is adequate irrespectively of the CFA actually used. An example of a 4-filter design for a CFA is shown in FIG. 8. This schematic CFA, coupled with the stop-band filter implies that the red, green, and blue pixels are actually sensitive to both visible (in their respective wavelengths) and near-infrared (all equally) energy. The NIR filter, on the other hand, is only sensitive to wavelengths greater than $\lambda_2$ (by design). The resulting "raw" sensor reading can therefore be demosaiced (either by standard or ad-hoc methods) so as to obtain a full resolution R, G, B and NIR image. Indeed, the information from the NIR-only pixels can be subtracted from the colour pixels so that they do only contain colour information. 4-filters CFAs for visible images have been proposed by Kodak and Sony, and it has thus been shown that adding a filter was not detrimental to image quality.

CFA-Only Design

Another proposed design is one where the hot-mirror is removed, but replaced with nothing, although it could be replaced by a piece of clear glass should camera focusing be an issue. Removing the hot-mirror entirely implies that all colour filters are going to be sensitive to near-infrared, but not to the same amount, notably between $\lambda_1$ and $\lambda_2$. To obtain a NIR image while preventing it to contaminate the visible image, one has to address the colour filters separately.

Figure 7:
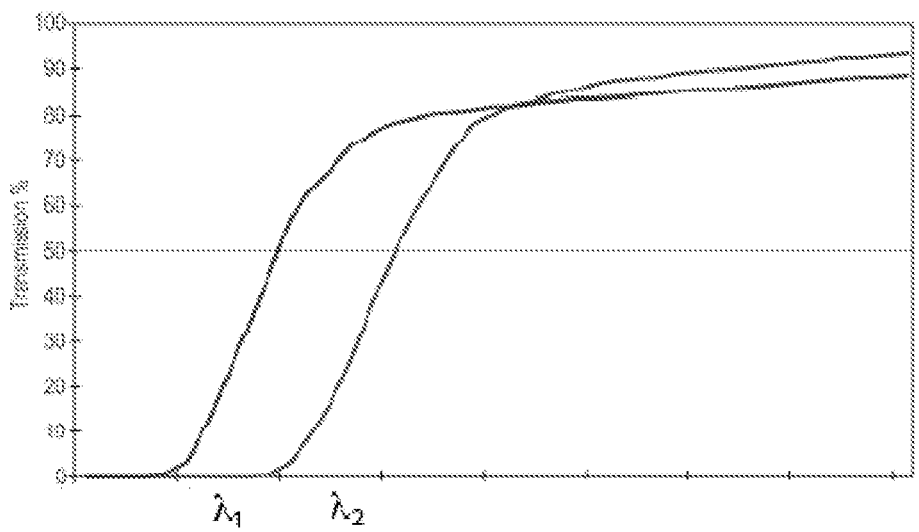
FIG. 7: The transmittance curves of two filters
Figure 9:
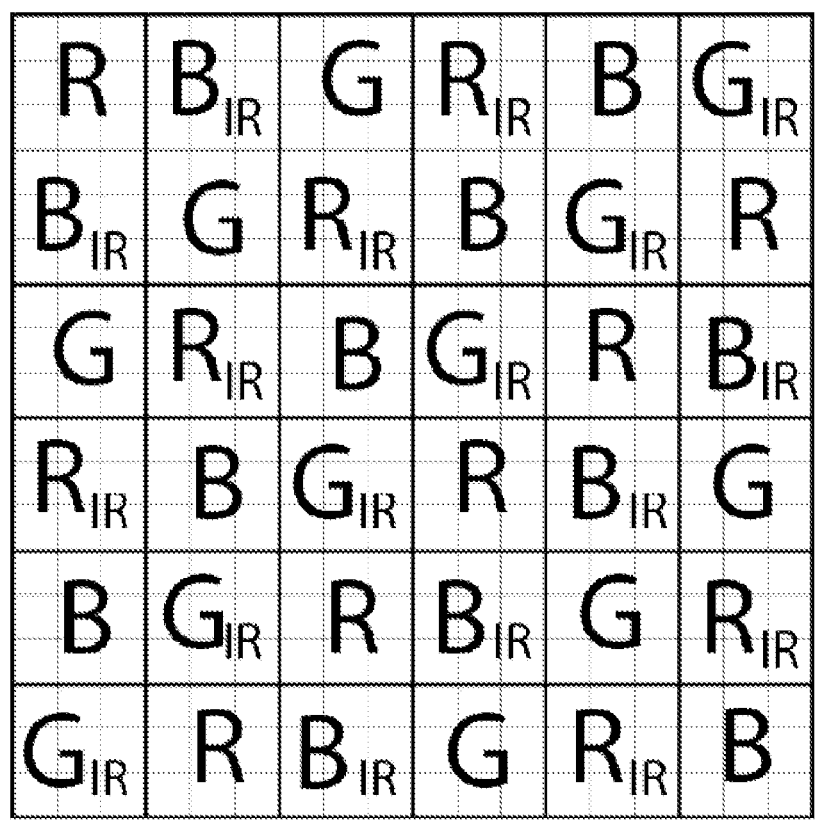
FIG. 9: An illustration of a 6-filter CFA.

The technique consists in appending a longpass NIR filter, whose transmittance is represented in FIG. 7 to some of the colour filters. This ensures that each colour filter type has its NIR transmittance correctly obtained. It follows that, as in the previous design, the NIR information from each colour filter can be removed, thus allowing a visible image to be obtained. The combination of the NIR-only signals can then also be used to create a NIR images. A schema of such a CFA, using red, green, and blue filters for the colour is shown in FIG. 9. As in the previous design, however, the exact number and placement of the filters can vary greatly depending on the objective function used. Since this design requires more filters than the previous one, the image is more subsampled at every channel, thus reducing the true resolution of the channels. Some colour filters, however, have identical NIR responses (e.g., the blue and green filters of most CFAs have identical transmittances from $\lambda_1$ onwards, and the number of different filter combinations can therefore be reduced.

Mathematically speaking, the same calculations as Eqs. (1)-(3) apply, with the modification that now $\omega_2 = [400, \lambda_3]$ and $\omega_3 = [\lambda_1, \lambda_3]$. It follows that the coloured filters' NIR response is not identical anymore, and thus infrared-only response has to be calculated for each colour. This approach requires more filters, but it still yields the same results, i.e., $K_V = K - K_{IR}$. Visible and near-infrared images can therefore also be obtained with this method.

This design, like the previous one can directly yield a colour and near-infrared image. The demosaicing can here too either come from existing techniques, or be ad-hoc, i.e., developed in conjunction with the CFA pattern. Indeed, the objective function (measuring the reconstruction error that one aims to minimise) employed in determining the arrangement of the filters on the sensor directly indicates how that data has to be converted back to form a full resolution image.

Camera Software

There are several ways of handling the sensor data once it has been acquired. Because of the mosaic aspect of the colour filter array, the sensor data needs to be demosaiced for display purposes. If one reverts to the Bayer pattern example, the sensor data is demosaiced to obtain a 3-channel image where the channels correspond to the CFA filters, i.e., we would have red, green, and blue channels. Applied to the present invention, one can consider the near-infrared image as either independent or belonging with the colour image. As such, one can consider storing this information as a single multi-channel image or as two images. The preferred method of proceeding being application dependent. A third option, for photographic purposes is to store the still mosaiced image, usually mentioned as "raw image", so that further processing can be done on another electronic device.

By capturing both visible and near-infrared in a simultaneous or sequential process, one effectively doubles the available wavelength range compared to a standard camera. It follows that significantly more information is acquired, information that can be used for image processing. Illuminants, for instance, have very different spectral characteristics, e.g., incandescent light sources have their maximum emission in the near-infrared while energy saving bulbs emit almost only in the visible. Consequently, comparing the visible and the NIR images (e.g., looking at energy ratios of the channels, a technique used to white-balance RGB images) provides important information about the imaged scene's incident light and an accurate white balance can thus be determined. Of course, the images do not need to be demosaiced to be used in that fashion. Given that the sensor resolution is, in current cameras, quite high, one can consider two adjacent pixels to belong to the same object. It follows that instead of comparing the information between full-resolution channels, one can compare information between different pixels of the still mosaiced image to provide the same effect.

The camera comprises usually different type of storage means. It comprises a first memory inside the camera (built-in memory) of a limited size for the temporary storage of data. In some camera models, the mass memory is a solid state memory (Flash) or a hard-drive and the images produced by the sensor are directly stored in this internal memory. A connector is provided to at a later stage download the memory content to an external memory or a computer. The image data can also be stored into a removable memory such as a memory stick, removable hard disk, magnetic tape. The images produced are then stored directly to the removable memory.

The camera according to the invention can comprises means to merge in a single file the visible and near-infrared images. This file can then be stored in either the internal memory or the removable memory.

According to another embodiment, the visible and near-infrared images are stored as two separate files within the camera or in the removable memory.

Instead or in addition to the generation of two images (visible and near-infrared images), the camera can store the sensor response data prior to, or without, combining the different filters response.

The invention claimed is:

1. A camera for simultaneously capturing a visible and near-infrared (NIR) image of one or more objects, the camera comprising:
   at least one colour filter array (CFA) including at least four different filters, said at least one colour filter array having visible and near-infrared light filters,
   at least one sensor unit configured to detect visible and near-infrared wavelengths, generate sensor response data based on the detected visible and near-infrared wavelengths, and generate the visible and near-infrared images based on the sensor response data; and at least one filter configured to block the near-infrared light in a range extending from a lowest near-infrared wavelength up to a wavelength in which all of the visible filters of said at least one colour filter array have an equal transmittance.

2. The camera according to claim 1, wherein the at least one filter is a stop-band filter placed in the camera such that light reaches the filter before reaching the at least one sensor unit.

3. The camera according to claim 1, wherein the at least one filter is in the at least one CFA and includes one or more additional CFA filters that let only near-infrared light pass.

4. The camera according to claim 1, wherein the at least one filter is in the at least one CFA and includes one or more additional CFA filters that let both visible and near-infrared light pass.

5. The camera according to claim 1, wherein the at least one filter is in the at least one CFA and includes one or more additional CFA filters that let only visible light pass.

6. The camera according to claim 1, further comprising:
a memory configured to electronically store the visible and near-infrared images.

7. The camera according to claim 6, wherein the memory is an internal memory configured to store the visible and near-infrared images as a single file.

8. The camera according to claim 6, wherein the memory is an internal memory configured to store the visible and near-infrared images as two separate files.

9. The camera according to claim 1, further comprising:
a memory configured to store the sensor response data prior to, or without, combining the different filters' response.

10. The camera according to claim 1, wherein the visible and near-infrared images are used to determine a camera white balance if one or more illuminants are present.

11. The camera according to claim 1, wherein the sensor response data is used prior to, or without, combining the different filters' response.

12. The camera according to claim 6, wherein the memory is a removable memory.

13. The camera according to claim 12, wherein the removable memory is configured to store the visible and near-infrared images as a single file.

14. The camera according to claim 12, wherein the removable memory is configured to store the visible and near-infrared images as two separate files.

* * * * *